(12) United States Patent
Kim

(10) Patent No.: US 6,734,105 B2
(45) Date of Patent: May 11, 2004

(54) METHOD FOR FORMING SILICON QUANTUM DOTS AND METHOD FOR FABRICATING NONVOLATILE MEMORY DEVICE USING THE SAME

(75) Inventor: Il Gweon Kim, Chungchongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 47 days.

(21) Appl. No.: 09/987,738

(22) Filed: Nov. 15, 2001

(65) Prior Publication Data

US 2002/0068457 A1 Jun. 6, 2002

(30) Foreign Application Priority Data

Nov. 17, 2000 (KR) ........................................ 2000-68406

(51) Int. Cl.[7] .............................................. H01L 21/302
(52) U.S. Cl. ........................ 438/694; 438/695; 438/699; 438/704; 438/705
(58) Field of Search ................................ 438/694, 695, 438/699, 704, 705, 728

(56) References Cited

U.S. PATENT DOCUMENTS

| 5,614,435 | A | | 3/1997 | Petroff et al. |
| 6,060,743 | A | * | 5/2000 | Sugiyama et al. ........... 257/321 |
| 6,326,311 | B1 | * | 12/2001 | Ueda et al. .................. 438/694 |
| 6,344,403 | B1 | * | 2/2002 | Madhukar et al. ........... 438/503 |
| 6,518,194 | B2 | * | 2/2003 | Winningham et al. ....... 438/717 |

* cited by examiner

*Primary Examiner*—Nadine G. Norton
*Assistant Examiner*—Binh X. Tran
(74) *Attorney, Agent, or Firm*—Morgan, Lewis & Bockius LLP

(57) ABSTRACT

A method for forming silicon quantum dots and a method for fabricating a nonvolatile memory device using the same, suitable for high speed and high packing density. The method for forming silicon quantum dots includes the steps of forming a first insulating film on a semiconductor substrate, forming a plurality of nano-crystalline silicons on the first insulating film, forming a second insulating film on the first insulating film including the nano-crystalline silicons, partially etching the second insulating film and the nano-crystalline silicons, and oxidizing surfaces of the nano-crystalline silicons.

6 Claims, 6 Drawing Sheets

METHOD FOR FORMING SILICON QUANTUM DOTS AND METHOD FOR FABRICATING NONVOLATILE MEMORY DEVICE USING THE SAME

This application claims the benefit of Korean Application No. P2000-68406 filed Nov. 17, 2000, which is hereby incorporated by reference.

BACKGROUND OF THE INVENTION

1. Field of the Invention

The present invention relates to a method for forming silicon quantum dots and a method for fabricating a nonvolatile memory device using the same, and more particularly, to a method for forming silicon quantum dots and a method for fabricating a nonvolatile memory device using the same which is suitable for high speed and high packing density.

2. Background of the Related Art

Generally, a nonvolatile memory device based on silicon quantum dots has operation principles equal to EEPROM. If a light gate voltage higher than a threshold voltage is applied to a channel in the same manner as a conventional MOSFET, an inversion layer is formed so that electrons of a source are induced to the channel. For this reason, channel conductance is lowered. In this state, electrons of the inversion layer in the channel are directly tunneled through a thin insulating film. Thus, silicon quantum dots two-dimensionally distributed on the tunneling insulating film are tunneled one by one. An energy barrier increases due to the charge energy of the tunneled electrons, thereby preventing the next electrons from being tunneled.

This makes charge energy by one of the tunneled electrons, higher than thermal oscillation of electrons by temperature. This is applied to a room temperature in the same manner. Even in cases where one electron is tunneled per silicon quantum dot having a constant density, channel conductance is lowered, thereby moving the threshold voltage in positive direction.

Although one electron per silicon quantum dot may be used for programming, a shift of the threshold voltage is too small to sense the amount of the channel conductance. Accordingly, for actual application, the shift of the threshold voltage of 1V or greater is used by tunneling three to four electrons.

In this respect, to increase the charge energy, it is necessary to lower self capacitance of the quantum dot to the maximum range. In this case, a surface area of the silicon quantum dot should be reduced to the minimum range. Also, to use a higher threshold voltage shift, a silicon quantum dot of high density is required.

Particularly, in using a constant threshold voltage shift, it is important to obtain uniformity of the silicon quantum dots and reproducibility of the formation process.

Meanwhile, the silicon quantum dots means dots formed for each unit of atoms. However, it is difficult to actually form the silicon quantum dots for each unit of atoms. Therefore, silicon quantum dots are silicon islands formed at a very small size that act as silicon quantum dots.

A related art method for forming silicon quantum dots and method for fabricating a nonvolatile memory device using the same will be described with reference to the accompanying drawings.

FIGS. 1a to 1f are sectional views of process steps showing a related art method for forming silicon quantum dots and method for fabricating a nonvolatile memory device.

As shown in FIG. 1a, field oxide films 12 are formed in a silicon substrate 11 in which an active region and a field region are defined by local oxidation of silicon (LOCOS) process. Subsequently, a tunneling insulating film 13 is formed on the silicon substrate 11, and a plurality of islands shaped silicon quantum dots 14 are formed on the tunneling insulating film 13 at a size of about 39 nm.

As shown in FIG. 1b, an insulating film 15 is formed on an entire surface of the silicon substrate 11 including the silicon quantum dots 14.

As shown in FIG. 1c, a polysilicon film for a control gate is formed on the insulating film 15 and then selectively removed by photolithography and etching processes to form a control gate 16.

As shown in FIG. 1d, the insulating film 15 and the silicon quantum dots 14 are selectively removed using the control gate 15 as a self mask. Subsequently, source/drain impurity ions are implanted into a surface of the silicon substrate 11 at both sides of the control gate 16 to form source/drain impurity regions 17.

As shown in FIG. 1e, an interleaving insulating film 18 is formed on the entire surface of the silicon substrate 11 by chemical vapor deposition method to insulate the control gate 16 from a metal line which will be formed later. A spin on glass (SOG) film 19 is formed on the interleaving insulating film 18.

Subsequently, the SOG film 19, the interleaving insulating film 18 and the tunneling insulating film 13 are selectively removed by photolithography and etching processes to partially expose a surface of the source/drain impurity regions 17. Thus, a contact hole 20 is formed.

As shown in FIG. 1f, a metal film is deposited by sputtering method on the entire surface of the silicon substrate 11 including the contact hole 20. The metal film is then selectively removed by photolithography and etching processes to form a metal line 21 which is connected to the source/drain impurity regions 17 through the contact hole 20.

However, the related art method for forming silicon quantum dots and method for fabricating a nonvolatile memory device using the same has several problems.

First, when depositing polysilicon or amorphous silicon, amorphous silicon seeding is only performed using incubation time (the time when initial silicon is seeded under the formation conditions of silicon). In this case, it is difficult to obtain stability of the process steps and to control the process steps.

Second, distribution uniformity of the silicon quantum dots is not good, having a great size and low density. Accordingly, it is not a reliable memory.

Third, if an amorphous silicon is formed, deformation in a configuration of the silicon quantum dots may occur due to the process steps of forming a grain and recrystallizing it in a later thermal process.

Finally, field disturbance due to adjacent drains may occur where LOCOS isolation is used, causing various problems related to functions of the memory.

SUMMARY OF THE INVENTION

Accordingly, the present invention is directed to a method for forming silicon quantum dots and a method for fabricating a nonvolatile memory device using the same that substantially obviates one or more of the problems due to limitations and disadvantages of the related art.

The present invention provides a method for forming silicon quantum dots and a method for fabricating a nonvolatile memory device using the same which is suitable for high speed and high packing density.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages and in accordance with the purpose of the present invention, as embodied and broadly described, a method for forming silicon quantum dots according to the present invention includes the steps of forming a first insulating film on a semiconductor substrate, forming a plurality of nano-crystalline silicons on the first insulating film, forming a second insulating film on the first insulating film including the nano-crystalline silicons, partially etching the second insulating film and the nano-crystalline silicons, and oxidizing surfaces of the nano-crystalline silicons.

In another aspect, a method for fabricating a nonvolatile memory device according to the present invention includes the steps of forming a tunnelling insulating film on a semiconductor substrate, forming a plurality of nano-crystalline silicons on the tunnelling insulating film, forming a first insulating film on the tunnelling insulating film including the nano-crystalline silicons, partially etching the first insulating film and the nano-crystalline silicons, oxidizing surfaces of the nano-crystalline silicons, forming a second insulating film on the first insulating film including the nano-crystalline silicons, forming a control gate on the second insulating film, removing the second insulating film, the nano-crystalline silicons, and the tunnelling insulating film using the control gate as a mask, and forming impurity regions in a surface of the semiconductor substrate at both sides of the control gate.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

As described above, although silicon quantum dots means dots formed for each unit of atoms, it is difficult to actually form the silicon quantum dots for each unit of atoms. The silicon quantum dots are used in view of the aspect that a silicon island is formed at a very small size acting as silicon quantum dots.

FIGS. 2a to 2d are sectional views of process steps showing a method for forming silicon quantum dots according to the present invention.

Figure 1A:
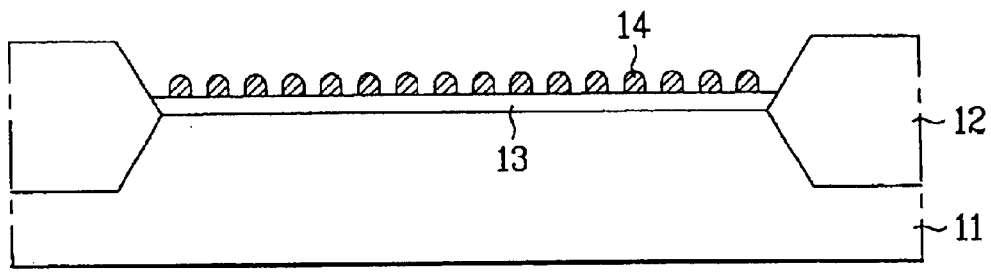
FIGS. 1a to 1f are sectional views of process steps showing a related art method for forming silicon quantum dots and method for fabricating a nonvolatile memory device using the same.
Figure 1B:
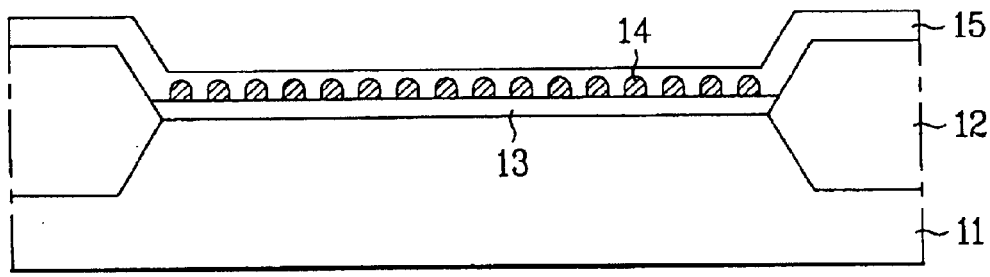
Figure 1C:
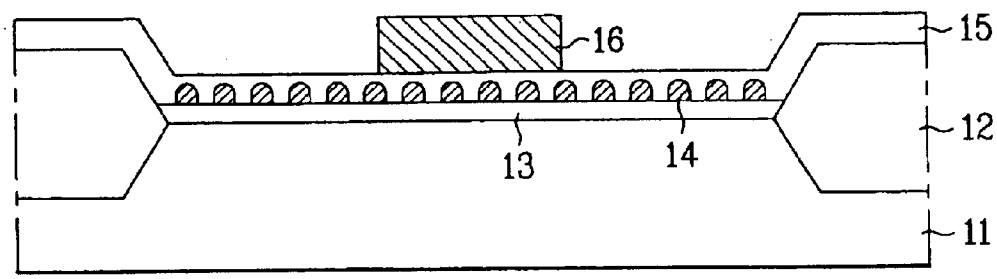
Figure 1D:
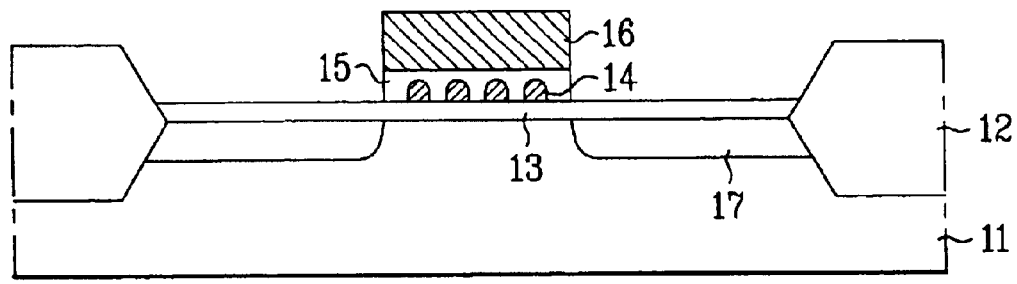
Figure 1E:
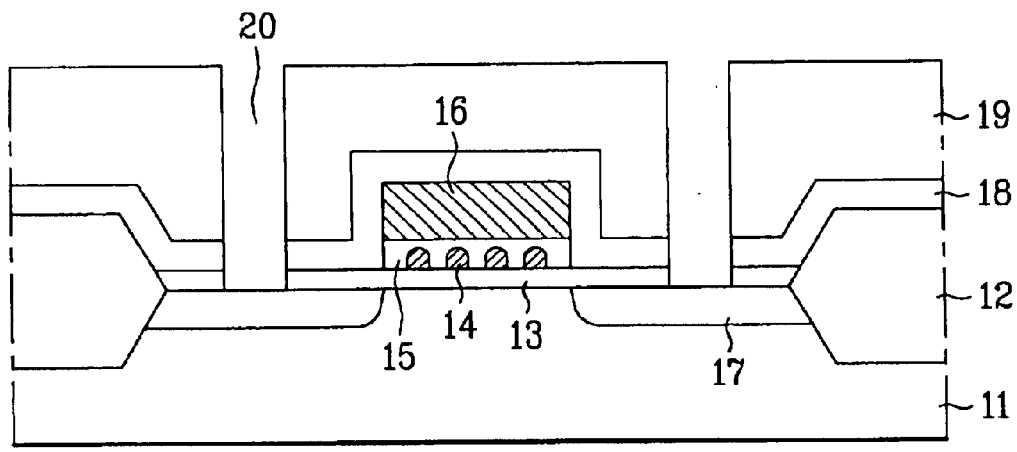
Figure 1F:
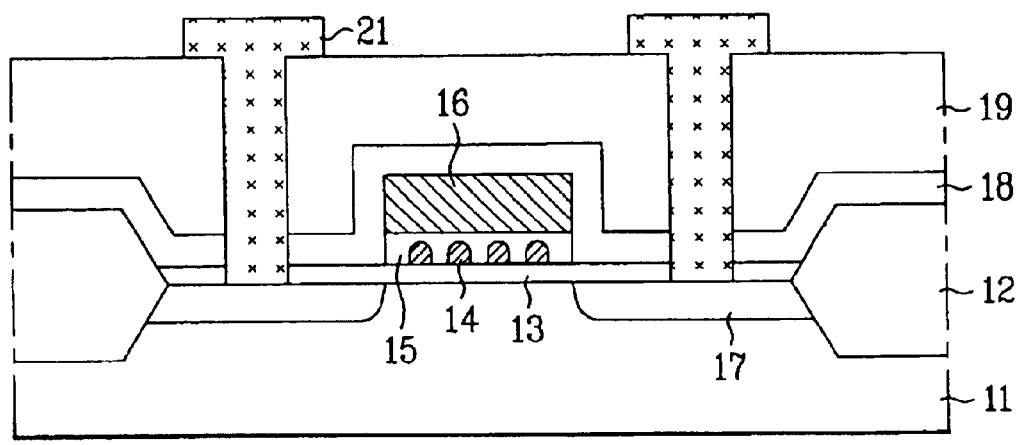
Figure 2A:
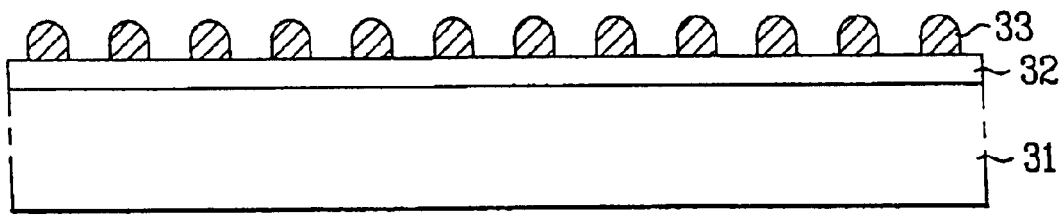
FIGS. 2a to 2d are sectional views of process steps showing a method for forming silicon quantum dots according to the present invention.

As shown in FIG. 2a, an insulating film 32 is formed on a silicon substrate 31, and island shaped nano-crystalline silicons (silicon quantum dots) 33 are formed on the insulating film 32 at a size of about 30 nm.

Figure 2B:
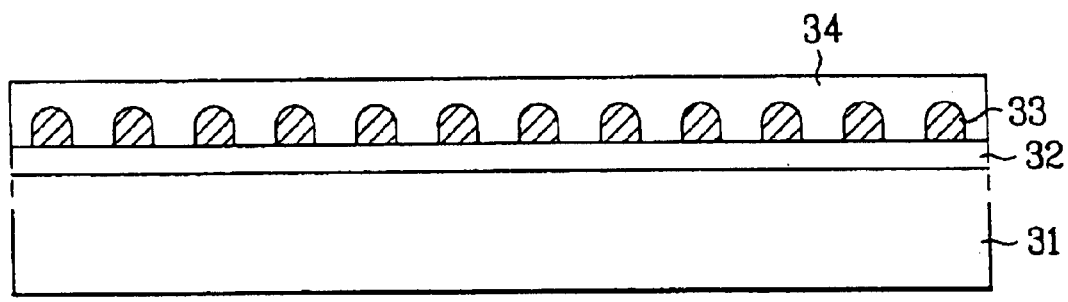

As shown in FIG. 2b, a first oxide film 34 is formed on an entire surface of the silicon substrate 31 including the nanocrystalline silicons 33.

Figure 2C:
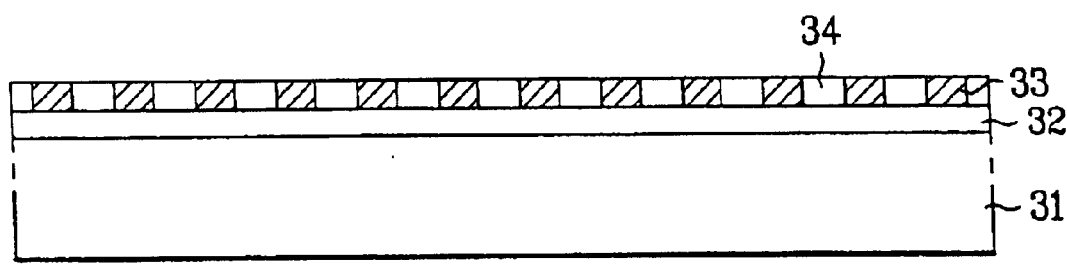

As shown in FIG. 2c, the first oxide film 34 and the nanocrystalline silicons 33 are etched by about 10 nm by chemical mechanical polishing (CMP) process.

Figure 2D:
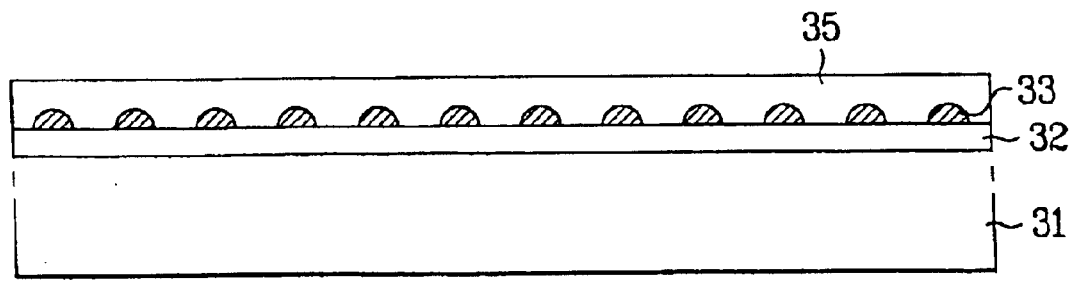

As shown in FIG. 2d, oxidation process is performed in the silicon substrate 31 to oxidize the nano-crystalline silicons 33 by 5 nm. Thus, the nano-crystalline silicons 33 of approximately 5 nm have a hemispheric shape of about 20 nm and a second oxide film 35 is formed.

Meanwhile, the first oxide film 34 may be removed before oxidation process. Re-oxidation process may be performed in a state that the first oxide film 34 remains without being removed. In the present invention, the first oxide film 34 has been removed.

FIGS. 3a to 3h are sectional views of process steps showing a method for fabricating a nonvolatile memory device using silicon quantum dots according to the present invention.

Figure 3A:
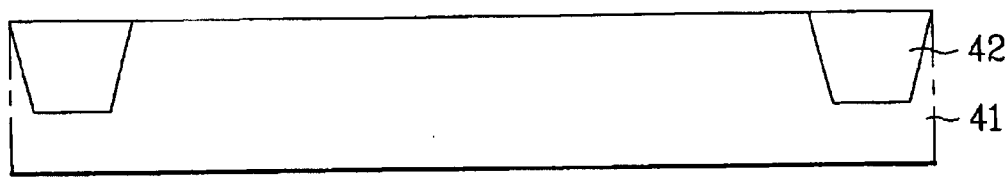
FIGS. 3a to 3h are sectional views of process steps showing a method for fabricating a nonvolatile memory device using the silicon quantum dots according to the present invention.

As shown in FIG. 3a, a silicon substrate 41 in which an active region and a field region are defined is formed. The field region is selectively removed by photolithography and etching processes to form a trench having a predetermined depth.

Subsequently, an insulating material is buried in the silicon substrate 41 to completely bury the trench, so that device isolation films 42 are formed.

Figure 3B:
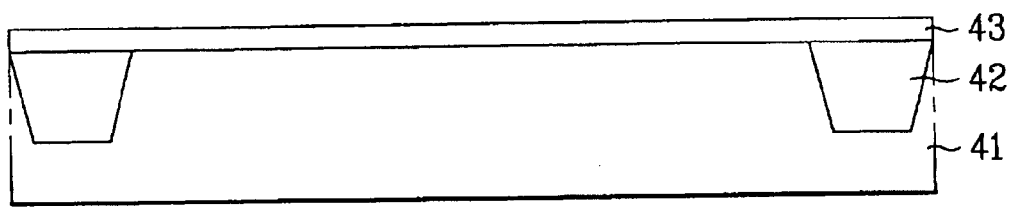

As shown in FIG. 3b, a tunneling insulating film 43 is formed on an entire surface of the silicon substrate 41.

Figure 3C:
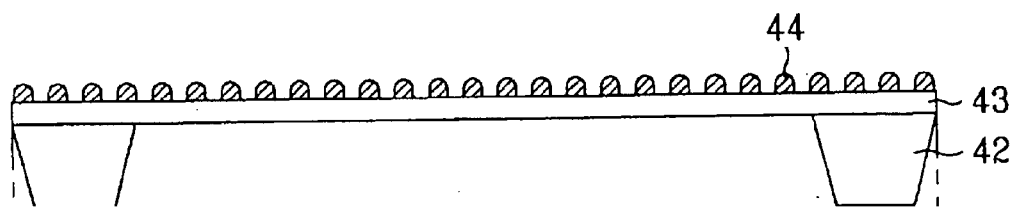

As shown in FIG. 3c, a plurality of island shaped nano-crystalline silicons (silicon quantum dots) 44 are formed on the tunneling insulating film 43 at a size of 5 nm chemical vapor deposition. In particular, after seeding amorphous silicon, the insulating film 43 is formed by chemical vapor deposition method and the amorphous silicon is polished by the CMP process.

At this instance, after the nano-crystalline silicons 44 are formed as shown in FIGS. 2a to 2d, the second oxide film 35 is removed.

Figure 3D:
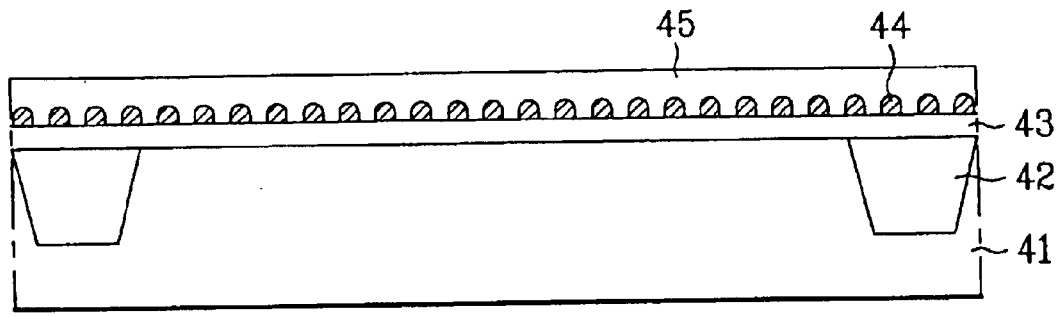

Thereafter, as shown in FIG. 3d, an insulating film 45 is formed on the entire surface of the silicon substrate 41 including the nano-crystalline silicons 44.

Figure 3E:
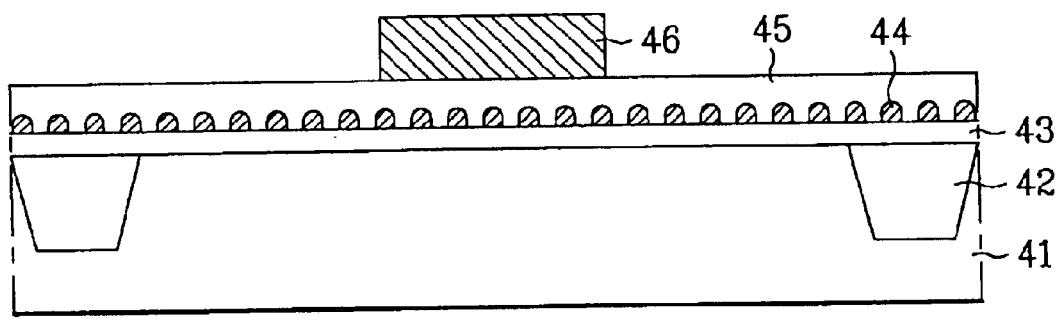

As shown in FIG. 3e, a polysilicon film for a control gate is formed on the insulating film 45 and then selectively removed by photolithography and etching processes to form a control gate 46.

Figure 3F:
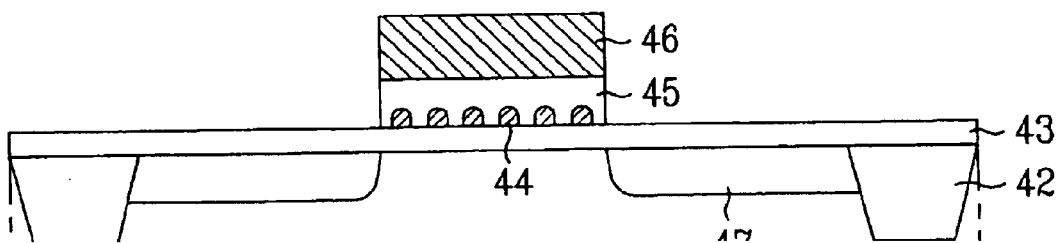

As shown in FIG. 3f, the insulating film 45 and the nanocrystalline silicon quantum dots 44 are selectively removed using the control gate 46 as a self mask.

Subsequently, source/drain impurity ions are implanted into the surface of the silicon substrate 41 at both sides of the control gate 46 to form source/drain impurity regions 47.

Figure 3G:
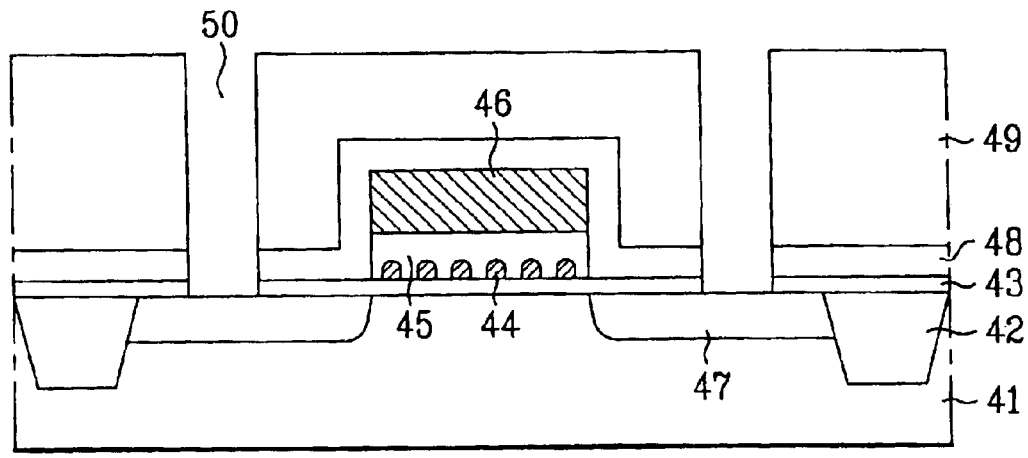

As shown in FIG. 3g, an interleaving insulating film 48 is formed on the entire surface of the silicon substrate 41 by chemical vapor deposition method to insulate the control gate 46 from a metal line which will be formed later. An SOG film 49 is then formed on the interleaving insulating film 48.

Afterwards, the SOG film 49, the interleaving insulating film 48, and the tunneling oxide film 43 are selectively removed by photolithography and etching processes to partially expose surfaces of the source/drain impurity regions 47, thereby forming a contact hole 50.

Figure 3H:
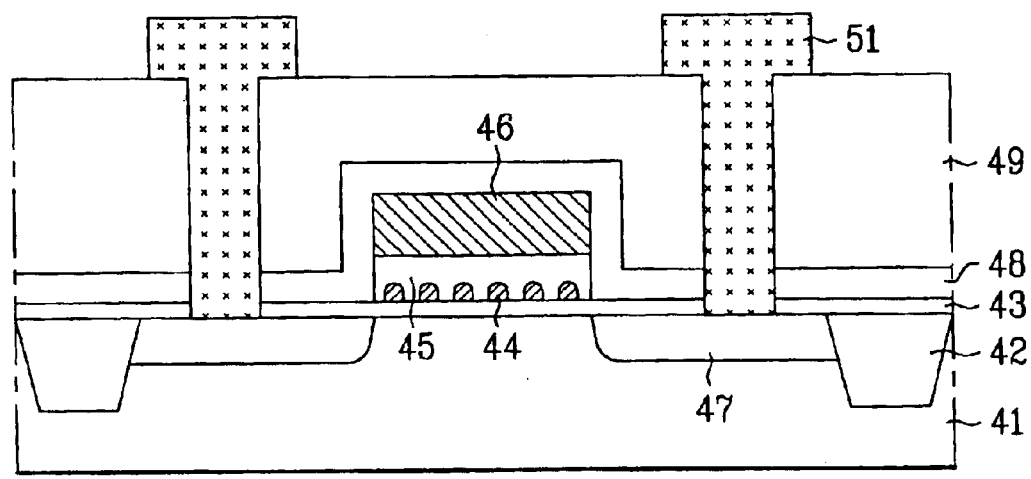

As shown in FIG. 3h, a metal film is deposited on the entire surface of the silicon substrate 41 including the contact hole 50 by sputtering method. The metal film is then selectively removed by photolithography and etching processes to form a metal line 51 which is connected to the source/drain impurity regions 47 through the contact hole 50.

As aforementioned, the method for forming silicon quantum dots and the method for fabricating a nonvolatile memory device using the same according to the present invention have the following advantages.

First, after seeding the amorphous silicon, the insulating film is formed by chemical vapor deposition method and the amorphous silicon is polished by the CMP process. Thus, silicon quantum dots of high density can be formed by oxidation process. Also, it is possible to improve reproducibility and controllability.

Second, field disturbance that may occur in a high integrated circuit due to adjacent drains can be reduced by forming the isolation films of STI structure.

Third, it is possible to maintain high and constant threshold voltage shift and stable operation at a room temperature, as required by a quantum dot memory, by uniformly controlling the silicon quantum dots at a small size.

Fourth, since three to four electrons per silicon quantum dot are directly tunneled through the tunneling insulating film, low voltage operation can be performed and rapid writing/erasing operations can be achieved. This improves retention characteristic by Coulomb blockade effect at a room temperature. Finally, it is possible to form a nonvolatile memory device of high packing density by reducing the size of the silicon quantum dot.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications and variations will be apparent to those skilled in the art. In the claims, means-plus-function clauses are intended to cover the structures described herein as performing the recited function and not only structural equivalents but also equivalent structures.

What is claimed is:

1. A method for forming silicon quantum dots comprising the steps of:
    forming a first insulating film on a semiconductor substrate;
    forming a plurality of nano-crystalline silicons on the first insulating film;
    forming a second insulating film on the first insulating film including the nano-crystalline silicons;
    partially etching the second insulating film and the nano-crystalline silicons; and
    oxidizing surfaces of the etched nano-crystalline silicons.

2. The method of claim 1, wherein the nano-crystalline silicons are formed at a size of about 30 nm.

3. The method of claim 1, wherein the nano-crystalline silicons are oxidized by about 5 nm.

4. A method for fabricating a nonvolatile memory device comprising the steps of:
    forming a tunnelling insulating film on a semiconductor substrate;
    forming a plurality of nano-crystalline silicons on the tunnelling insulating film;
    forming a first insulating film on the tunnelling insulating film including the nano-crystalline silicons;
    partially etching the first insulating film and the nano-crystalline silicons;
    oxidizing surfaces of the nano-crystalline silicons;
    forming a second insulating film on the first insulating film including the nano-crystalline silicons;
    forming a control gate on the second insulating film;
    removing the second insulating film, the nano-crystalline silicons, and the tunnelling insulating film using the control gate as a mask; and
    forming impurity regions in a surface of the semiconductor substrate at both sides of the control gate.

5. The method of claim 4, wherein the nano-crystalline silicons are formed at a size of about 30 nm.

6. The method of claim 4, wherein the nano-crystalline silicons are oxidized by about 5 nm.

* * * * *